United States Patent
Agata et al.

(10) Patent No.: US 12,266,532 B2
(45) Date of Patent: *Apr. 1, 2025

(54) SEMICONDUCTOR DEVICE AND FABRICATION METHOD

(71) Applicant: FUJI ELECTRIC CO., LTD., Kanagawa (JP)

(72) Inventors: Yasunori Agata, Matsumoto (JP); Takahiro Tamura, Matsumoto (JP); Toru Ajiki, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/513,624

(22) Filed: Nov. 19, 2023

(65) Prior Publication Data

US 2024/0096629 A1    Mar. 21, 2024

Related U.S. Application Data

(63) Continuation of application No. 17/847,170, filed on Jun. 23, 2022, now Pat. No. 11,854,782, which is a
(Continued)

(30) Foreign Application Priority Data

Nov. 16, 2018 (JP) ................. 2018-215548

(51) Int. Cl.
*H01L 29/00* (2006.01)
*H01L 21/22* (2006.01)
(Continued)

(52) U.S. Cl.
CPC ...... *H01L 21/221* (2013.01); *H01L 21/26526* (2013.01); *H01L 27/0664* (2013.01);
(Continued)

(58) Field of Classification Search
CPC ......... H01L 29/32; H01L 29/36; H01L 21/22; H01L 21/221
See application file for complete search history.

(56) References Cited

U.S. PATENT DOCUMENTS 10,134,832 B2   11/2018   Agata
10,381,225 B2   8/2019    Mukai
(Continued)

FOREIGN PATENT DOCUMENTS

CN   101405660 A   4/2009
CN   103946983 A   7/2014
(Continued)

OTHER PUBLICATIONS

Written Opinion (ISA/237) of the International Search Authority for International Patent Application No. PCT/JP2019/044759, issued/mailed by the Japan Patent Office on Jan. 21, 2020.
(Continued)

*Primary Examiner* — Reema Patel

(57) ABSTRACT

A semiconductor device comprising a semiconductor substrate having upper and lower surfaces and a hydrogen containing region containing hydrogen and a lifetime control region is provided. The carrier concentration distribution of the hydrogen containing region has: a first local maximum point; a second local maximum point closest to the first local maximum point among local maximum points positioned between the first local maximum point and the upper surface; a first intermediate point of the local minimum between the first and second local maximum points; and a second intermediate point closest to the second local maximum point among local minimum points or flat points where the carrier concentration remains constant positioned between the second local maximum point and the upper surface. The lifetime control region is positioned at least
(Continued)

between the first and second local maximum points. The first intermediate point has a lower carrier concentration than the second intermediate point.

15 Claims, 8 Drawing Sheets

Related U.S. Application Data continuation of application No. 17/079,545, filed on Oct. 26, 2020, now Pat. No. 11,373,869, which is a continuation of application No. PCT/JP2019/044759, filed on Nov. 14, 2019.

(51) Int. Cl.
| | |
|---|---|
| *H01L 21/265* | (2006.01) |
| *H01L 27/06* | (2006.01) |
| *H01L 29/32* | (2006.01) |
| *H01L 29/36* | (2006.01) |
| *H01L 29/739* | (2006.01) |
| *H01L 29/861* | (2006.01) |

(52) U.S. Cl.
CPC .............. *H01L 29/32* (2013.01); *H01L 29/36* (2013.01); *H01L 29/7397* (2013.01); *H01L 29/8613* (2013.01)

(56) References Cited

U.S. PATENT DOCUMENTS

| | | | |
|---|---|---|---|
| 10,734,230 B2 | 8/2020 | Tamura | |
| 11,854,782 B2 * | 12/2023 | Agata | ................ H01L 29/7397 |
| 2003/0057522 A1 | 3/2003 | Francis | |
| 2005/0236626 A1 | 10/2005 | Takafuji | |
| 2007/0221620 A1 | 9/2007 | Sakthivel | |
| 2013/0249058 A1 | 9/2013 | Neidhart | |
| 2014/0217463 A1 | 8/2014 | Schulze | |
| 2014/0246750 A1 | 9/2014 | Takishita | |
| 2015/0270132 A1 | 9/2015 | Laven | |
| 2015/0357229 A1 | 12/2015 | Schulze | |
| 2016/0141399 A1 | 5/2016 | Jelinek | |
| 2016/0172438 A1 | 6/2016 | Jelinek | |
| 2016/0276446 A1 | 9/2016 | Wakimoto | |
| 2016/0276470 A1 | 9/2016 | Gouda | |
| 2016/0329401 A1 | 11/2016 | Laven | |
| 2017/0271447 A1 | 9/2017 | Tamura | |
| 2018/0005829 A1 | 1/2018 | Takishita | |
| 2018/0012762 A1 | 1/2018 | Mukai | |
| 2018/0122895 A1 | 5/2018 | Jelinek | |
| 2018/0166279 A1 | 6/2018 | Tamura | |

FOREIGN PATENT DOCUMENTS

| | | | |
|---|---|---|---|
| CN | 105814694 | A | 7/2016 |
| CN | 107004723 | A | 8/2017 |
| CN | 107408576 | A | 11/2017 |
| CN | 107408581 | A | 11/2017 |
| CN | 107851584 | A | 3/2018 |
| JP | 2002208596 | A | 7/2002 |
| JP | 2004265968 | A | 9/2004 |
| JP | 2007266233 | A | 10/2007 |
| JP | 2015095559 | A | 5/2015 |
| TW | 200537647 | A | 11/2005 |
| WO | 2013089256 | A1 | 6/2013 |
| WO | 2016204227 | A1 | 12/2016 |
| WO | 2017002619 | A1 | 1/2017 |
| WO | 2017047276 | A1 | 3/2017 |
| WO | 2017047285 | A1 | 3/2017 |
| WO | 2017146148 | A1 | 8/2017 |

OTHER PUBLICATIONS

Office Action issued for counterpart Japanese Application No. 2022-079956, transmitted from the Japanese Patent Office on Jul. 4, 2023 (drafted on Jun. 27, 2023).
Office Action issued for counterpart Chinese Application 201980028305.4, issued by The State Intellectual Property Office of People's Republic of China on Aug. 9, 2023.
Those references were submitted as IDS or found by the examiner over the earlier U.S. Appl. No. 17/079,545, filed Oct. 26, 2020.
Those references were submitted as IDS or found by the examiner over the earlier U.S. Appl. No. 17/847,170, filed Jun. 23, 2022.

* cited by examiner

SEMICONDUCTOR DEVICE AND FABRICATION METHOD

CROSS-REFERENCE TO RELATED APPLICATIONS

This application is a continuation of U.S. patent application Ser. No. 17/847,170, filed on Jun. 23, 2022, which is a continuation of U.S. patent application Ser. No. 17/079,545, filed on Oct. 26, 2020, which is a continuation of International Patent Application No. PCT/JP2019/044759, filed on Nov. 14, 2019, the entirety of each of which is incorporated herein by reference. The application also claims priority from the following Japanese patent application, which is explicitly incorporated herein by reference:
No. 2018-215548 filed in JP on Nov. 16, 2018.

BACKGROUND

1. Technical Field

The present invention relates to a semiconductor device and a fabrication method.

2. Related Art

Conventionally, it is known to form an N type region by implanting hydrogen to a semiconductor substrate (for example, see Patent document 1 and 2).
[Patent document 1] Japanese translation of PCT International Patent Application No. 2017-47285
[Patent document 2] Japanese translation of PCT International Patent Application No. 2017-146148

Technical Problem

It is preferred that the shape of a carrier concentration distribution can be controlled with high accuracy.

GENERAL DISCLOSURE

To solve the above-mentioned problem, a first aspect of the present invention provides a semiconductor device including a semiconductor substrate. The semiconductor substrate may have a hydrogen containing region that contains hydrogen. The hydrogen containing region may contain helium in at least some region. A hydrogen chemical concentration distribution of the hydrogen containing region in a depth direction has one or more hydrogen concentration trough portions, and in each of the hydrogen concentration trough portions the hydrogen chemical concentration may be equal to or higher than $1/10$ of an oxygen chemical concentration.

In each of the hydrogen concentration trough portions, the hydrogen chemical concentration may be equal to or higher than a carbon chemical concentration.

The hydrogen chemical concentration distribution of the hydrogen containing region in the depth direction may have one or more hydrogen concentration peaks. At the hydrogen concentration peaks, the hydrogen chemical concentration may be equal to or higher than $1/2$ of the oxygen chemical concentration.

In at least one of the hydrogen concentration trough portions, the hydrogen chemical concentration may be equal to or higher than a helium chemical concentration.

A helium chemical concentration distribution of the hydrogen containing region in the depth direction may have a helium concentration peak. In a hydrogen concentration trough portion provided at a deeper position than the helium concentration peak, the hydrogen chemical concentration may be equal to or higher than the helium chemical concentration.

The hydrogen chemical concentration distribution may have a plurality of hydrogen concentration peaks. The full width at half maximum of the helium concentration peak in the helium chemical concentration distribution may be larger than an interval between each of the hydrogen concentration peaks.

The helium concentration peak may be located between two hydrogen concentration peaks in the depth direction.

The hydrogen chemical concentration distribution may have two or more hydrogen concentration peaks at deeper positions than the helium concentration peak. A carrier concentration distribution of the hydrogen containing region in the depth direction may have two or more hydrogen corresponding peaks located at substantially the same depth as the hydrogen concentration peak at deeper positions than the helium concentration peak. The carrier concentration distribution between each of the hydrogen corresponding peaks may have no peak at a deeper position than the helium concentration peak.

The carrier concentration distribution may have a carrier concentration trough portion between each of the hydrogen corresponding peaks. A local minimum of the carrier concentration in the carrier concentration trough portion at substantially the same depth position as the helium concentration peak may be lower than local minimums of the carrier concentration in the carrier concentration trough portions before and after the carrier concentration trough portion. The local minimum of the carrier concentration in the carrier concentration trough portion at substantially the same depth position as the helium concentration peak may be higher than a base doping concentration in the semiconductor substrate.

A second aspect of the present invention provides a fabrication method of a semiconductor device including a semiconductor substrate. In the fabrication method, a hydrogen containing region may be formed by implanting hydrogen to the semiconductor substrate. In the fabrication method, helium may be implanted to the semiconductor substrate so that at least some region of the hydrogen containing region contains helium. Hydrogen may be implanted to the semiconductor substrate so that the hydrogen chemical concentration distribution of the hydrogen containing region in a depth direction has one or more hydrogen concentration trough portions, and in at least one hydrogen concentration trough portion the hydrogen chemical concentration is equal to or higher than $1/10$ of the oxygen chemical concentration.

The summary clause does not necessarily describe all necessary features of the embodiments of the present invention. The present invention may also be a sub-combination of the features described above.

DESCRIPTION OF EXEMPLARY EMBODIMENTS

Figure 1:
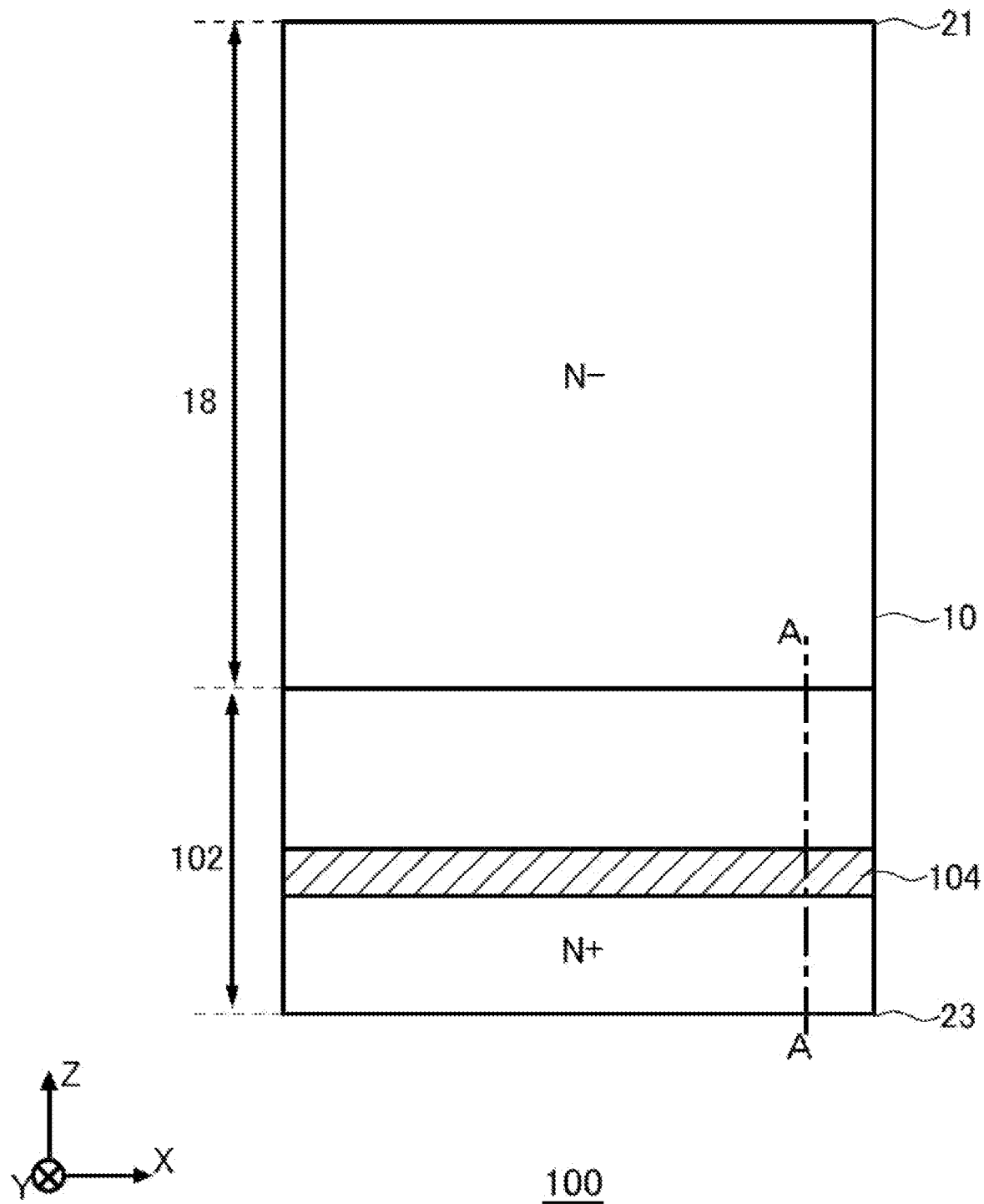
FIG. 1 is a cross sectional view showing one example of a semiconductor device 100.

The following describes the present invention through embodiments of the invention, but the following embodiments do not limit the invention according to the claims. In addition, not all the combinations of features described in the embodiment are necessarily required in solutions of the invention.

As used herein, one side in a direction parallel to a depth direction of a semiconductor substrate is referred to as 'upper' and the other side is referred to as 'lower'. One surface of two principal surfaces of a substrate, a layer or other member is referred to as upper surface, and the other surface is referred to as lower surface. An "upper" and "lower" direction is not limited to a direction of gravity, or a direction in which the semiconductor device is mounted.

In this specification, technical matters may be described using orthogonal coordinate axes of an X axis, a Y axis, and a Z axis. The orthogonal coordinate axes are only to specify relative positions of components, and shall not limit them to specific directions. For example, the Z-axis shall not exclusively indicate a height direction relative to the ground. Further, a +Z axis direction and a −Z axis direction are directions opposite to each other. When the Z axis direction is described without describing the sign, it means that the direction is parallel to the +Z axis and the −Z axis.

In the specification, a case where a term such as "same" or "equal" is mentioned may include an error due to a variation in manufacturing or the like. The error is, for example, within 10%. Moreover, the expressions "substantially the same" and "substantially equal" may be used to include the error.

As used herein, a chemical concentration refers to a concentration of an impurity measured regardless of its state of activation. The chemical concentration can be measured by, for example, secondary ion mass spectrometry (SIMS). In this specification, a doping concentration refers to a concentration of donors and acceptors. The concentration difference between a donor and an acceptor may be a net doping concentration of either the donor or the acceptor whose concentration is higher than the other. The concentration difference can be measured by the capacitance-voltage method (CV method). A concentration measured by the CV method may be used as the carrier concentration. Moreover, the carrier concentration can also be measured by the spreading resistance analysis (SR). In an N type region or a P type region, when the carrier concentration, the doping concentration or the chemical concentration has a peak, the peak value may be the concentration value in the region. In the region, for example, when the carrier concentration, the doping concentration or the chemical concentration is approximately uniform, the average value of concentration in the region may be the concentration value in the region.

When referring merely to a "concentration" herein, it refers to a concentration per unit volume (/cm$^3$). For example, a chemical concentration of an impurity is the number of atoms of the impurity contained per unit volume (atoms/cm$^3$).

FIG. 1 is a cross sectional view showing one example of a semiconductor device 100. The semiconductor device 100 is provided with a transistor device such as an insulated gate bipolar transistor (IGBT) and a diode device such as a freewheeling diode (FWD), although structural details of these devices are omitted in FIG. 1.

The semiconductor device 100 includes a semiconductor substrate 10. The semiconductor substrate 10 is a substrate that is formed of a semiconductor material. As an example, the semiconductor substrate 10 is a silicon substrate. The semiconductor substrate 10 contains an impurity that is added intendedly or unintendedly at the time of manufacturing a semiconductor ingot. The semiconductor substrate 10 has a doping concentration determined by an impurity or the like implanted at the time of manufacturing or other substances. The conductivity type of the semiconductor substrate 10 of the present example is an N-type. In the specification, the doping concentration in the semiconductor substrate 10 may be referred to as base doping concentration Db.

As an example, when the semiconductor ingot is made of silicon, an N type impurity (dopant) for setting the base doping concentration Db is phosphorous, antimony, arsenic or the like, and a P type impurity (dopant) is boron, aluminum or the like. The base doping concentration Db may be lower than the chemical concentration of the dopant of the semiconductor ingot. As an example, when the dopant is phosphorous or boron, the base doping concentration Db may be equal to or higher than 50%, or alternatively equal to or higher than 90%, of the chemical concentration of the dopant. As another example, when the dopant is antimony, the base doping concentration Db may be equal to or higher than 5%, or alternatively equal to or higher than 10%, or alternatively equal to or higher than 50% of the chemical concentration of the dopant. In addition, the semiconductor substrate 10 may contain carbon and oxygen. The carbon and oxygen may be distributed in the entire semiconductor substrate 10. A fabrication method of the semiconductor ingot is, as an example, the magnetic field application Czochralski (MCZ) method, although other methods may be used. Other methods may include the Czochralski method and the float zone (FZ) method.

The semiconductor substrate 10 has an upper surface 21 and a lower surface 23. The upper surface 21 and the lower surface 23 are two principal surfaces of the semiconductor substrate 10. In the specification, orthogonal axes in the plane that is parallel to the upper surface 21 and the lower surface 23 is referred to as an x axis and a y axis, and the perpendicular axis to the upper surface 21 and the lower surface 23 is referred to as a z axis.

The semiconductor substrate 10 has a hydrogen containing region 102 that contains hydrogen. In the present example, hydrogen ions are implanted to the hydrogen containing region 102 from the lower surface 23 side of the semiconductor substrate 10. In the present example, the hydrogen ions are protons. The hydrogen ions may be deuterons or tritons. The hydrogen containing region 102 is the region where the chemical concentration of hydrogen is higher than the chemical concentration of any of other N type impurities and P type impurities. In the hydrogen containing region 102, the chemical concentration of hydrogen may be equal to or higher than 100 times the chemical concentration of an impurity, among other N type impurities and P type impurities, whose chemical concentration is the highest. The hydrogen containing region 102 may be a region where the chemical concentration of hydrogen is equal to or higher than 10 times the base doping concentration Db. The hydrogen containing region 102 may be a region where the chemical concentration of hydrogen is higher than the base doping concentration Db. The hydrogen containing region 102 contains helium in at least some region. The helium may function as an adjustment impurity for adjusting the lifetime of carriers of the semiconductor substrate 10.

The hydrogen ions implanted from the lower surface 23 of the semiconductor substrate 10 pass through the interior of the semiconductor substrate 10 to a depth corresponding to acceleration energy. In the region where the hydrogen ions have passed through, a vacancy defect such as a vacancy (V) or a divacancy (VV) is formed. In the specification, unless otherwise specified, a vacancy includes a divacancy. The vacancy defect may contain an unsatisfied valence (dangling bond) that exists in a vacancy or divacancy, and may contain an unpaired electron of the dangling bond. Hydrogen is diffused by performing thermal treatment of the semiconductor substrate 10 after implanting hydrogen ions. The diffused hydrogen attaches to a vacancy and oxygen, thereby forming a VOH defect. The VOH defect serves as a donor that provides an electron. In addition, the diffused hydrogen itself is activated to serve as a hydrogen donor. Therefore, the hydrogen containing region 102 becomes an N+ type region where the chemical concentration of hydrogen is higher than the base doping concentration Db. Note that, unless otherwise specified in the specification, the term "VOH defect" is used to include a hydrogen donor or alternatively a donor that is newly formed by hydrogen ion implantation.

The hydrogen containing region 102 of the present example includes a lifetime control region 104. The lifetime control region 104 is a region where the lifetime of carriers is reduced because a lifetime killer that adjusts the lifetime of carriers is formed in the region. The lifetime killer is a recombination center of carriers, which may be a crystal defect, and may be a vacancy defect such as a vacancy and a divacancy, a defect complex thereof with an element constituting the semiconductor substrate 10 or impurities other than this element, a disposition, a rare gas element such as helium, neon, argon or the like, or a metal element such as platinum or the like. In the present example, a vacancy defect caused by implanting helium to the semiconductor substrate 10, for example, serves as a lifetime killer.

In the present example, the lifetime control region 104 is formed by implanting helium from the lower surface 23 side of the semiconductor substrate 10. In the specification, when a relative position in the depth direction of the semiconductor substrate 10 is expressed as for example deep or shallow, such depth is measured relative to the lower surface 23. That is, an element that is provided at a deeper position is more spaced from the lower surface 23, and an element that is provided at a shallower position is less spaced from the lower surface 23. Note that, when a depth is represented with a reference plane specified, the depth from said reference plane is indicated.

A drift region 18 may be provided in the semiconductor substrate 10. The drift region 18 is a region of N-type having a doping concentration lower than that of the hydrogen containing region 102. The doping concentration of the drift region 18 may be the same as the base doping concentration Db. The drift region 18 may include a region where the doping concentration is higher than the base doping concentration Db. A doping concentration distribution of the drift region 18 may be approximately uniform or flat within a predetermined depth range L0. The uniform or flat distribution means that, as an example, within the predetermined depth range L0, a variation in the doping concentration falls within the value range of no less than 80% and no more than 120% of the base doping concentration Db. The predetermined depth range L0 may be a length within 10% (that is, L0≤0.1 W0), or may be a length within 30% (that is, L0≤0.3 W0), or may be a length within 50% (that is, L0≤0.5 W0), or may be a length within 70% (that is, L0≤0.7 W0) of the thickness W0 of the semiconductor substrate 10.

Figure 2:
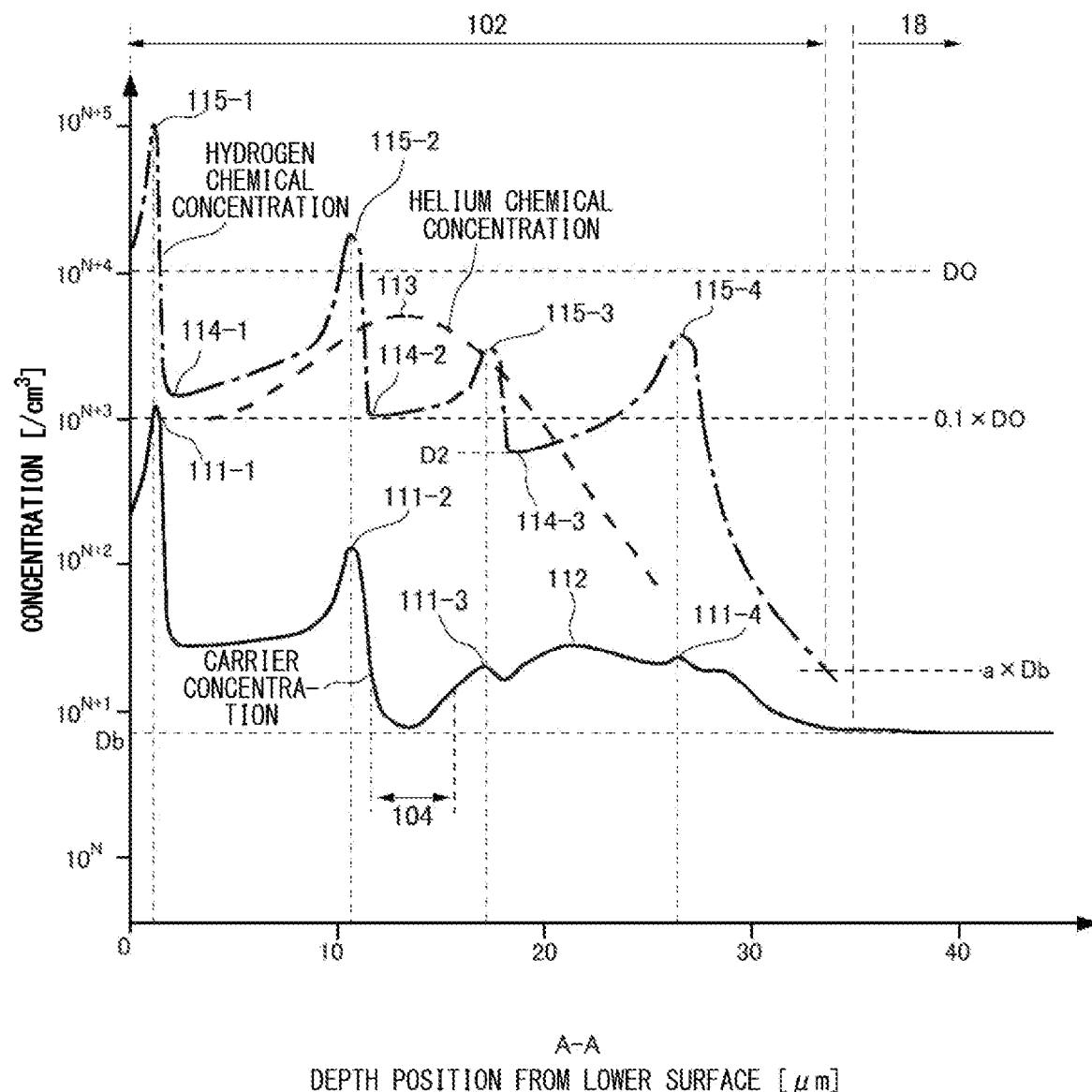
FIG. 2 is a diagram showing a reference example of a hydrogen chemical concentration distribution, a helium chemical concentration distribution and a carrier concentration distribution along the line A-A in FIG. 1.

FIG. 2 is a diagram showing a reference example of a hydrogen chemical concentration distribution, a helium chemical concentration distribution and a carrier concentration distribution along the line A-A in FIG. 1. The line A-A contains the entire hydrogen containing region 102 in the depth direction and a part of the drift region 18. In diagrams showing a concentration distribution such as that in FIG. 2 or the like, a vertical axis is a logarithmic axis that indicates each concentration, and a horizontal axis is a linear axis that indicates a depth position from the lower surface 23. Note that a concentration distribution in each drawing shows a distribution upon completion of the semiconductor device 100 (that is, after thermal treatment). In addition, the hydrogen chemical concentration and the helium chemical concentration in FIG. 2 is concentration measured, for example, by SIMS method. The carrier concentration in FIG. 2 is measured by SR method, for example.

The hydrogen chemical concentration distribution in the hydrogen containing region 102 has one or more hydrogen concentration peaks 115 and one or more hydrogen concentration trough portions 114. If the hydrogen chemical concentration distribution has a plurality of hydrogen concentration peaks 115, hydrogen ions may be implanted to the semiconductor substrate 10 multiple times with varied ranges. Varied ranges may be varied acceleration energies of hydrogen ions upon ion implantation. The hydrogen chemical concentration distribution in the present example has, in order from the lower surface 23 side of the semiconductor substrate 10, a hydrogen concentration peak 115-1, a hydrogen concentration trough portion 114-1, a hydrogen concentration peak 115-2, a hydrogen concentration trough portion 114-2, a hydrogen concentration peak 115-3, a hydrogen concentration trough portion 114-3, and a hydrogen concentration peak 115-4. A peak may be a mountain-shaped portion that contains a point of a local maximum in a concentration distribution. A trough portion may be a trough-shaped portion that contains a point of a local minimum in a concentration distribution.

The helium chemical concentration distribution has a helium concentration peak 113. The helium concentration peak 113 may be located between two hydrogen concentration peaks 115 (in the present example, the hydrogen concentration peak 115-2 and the hydrogen concentration peak 115-3). For example, a depth position at which the helium concentration peak 113 has its local maximum is not contained within the range of the full width at half maximum (FWHM) of any of the hydrogen concentration peaks 115. Offsetting the position of the helium concentration peak 113 from those of the hydrogen concentration peaks 115 can leave vacancy defects formed by helium radiation unattached to hydrogen. As a result, carrier lifetime can be reduced. Thus, the lifetime control region 104 can be easily formed. If helium is implanted from the lower surface 23 side, a gradient of the slope closer to the lower surface 23 side than a local maximum of the helium chemical concentration distribution tends to be smaller than a gradient of the slope opposite to the lower surface 23.

The carrier concentration distribution has one or more hydrogen corresponding peaks 111. The hydrogen corresponding peaks 111 are peaks in the carrier concentration distribution that are located at the same depth as the hydrogen concentration peaks 115. Note that the depth positions of the hydrogen concentration peaks 115 and the depth positions of the hydrogen corresponding peaks 111 may not be exactly identical. For example, if the point where a hydrogen corresponding peak 111 has its local maximum is contained within the range of the full width at half maximum of a hydrogen concentration peak 115, the hydrogen concentration peak 115 and the hydrogen corresponding peak 111 may be located at the same depth position. The carrier concentration distribution in the present example has, in order from the lower surface 23 side of the semiconductor substrate 10, a hydrogen corresponding peak 111-1, a hydrogen corresponding peak 111-2, a hydrogen corresponding peak 111-3, and a hydrogen corresponding peak 111-4. A hydrogen corresponding peak 111-$m$ is located at the same depth as a hydrogen concentration peak 115-$m$. $m$ is an integer not less than 1.

As described above, in the hydrogen containing region 102, VOH defects and hydrogen itself serve as donors. Thus, the donor concentration distribution and the carrier concentration distribution in the hydrogen containing region 102 are similar to the hydrogen concentration distribution. That is, by controlling the hydrogen concentration distribution, the donor concentration distribution and the carrier concentration distribution in the hydrogen containing region 102 can be adjusted.

When helium is implanted to the lifetime control region 104, vacancies are formed due to the implantation of helium. Some of the vacancies become VOH defects by attaching to hydrogen and oxygen that exist in the hydrogen containing region 102. In the vicinity of the range of helium, vacancies are formed in high concentration so that at least one of hydrogen and oxygen is insufficient for the vacancies. Thus, the proportion of vacancies that remains without becoming VOH defects becomes higher. As a result, carrier concentration is lowered in the lifetime control region 104. On the other hand, in a region far from the range of helium, the concentration of vacancies is lowered so that hydrogen and oxygen are sufficient for the vacancies. Thus, the proportion of the vacancies that remains without becoming VOH defects becomes lower. As a result, in the region far from the range of helium, VOH defects caused by helium implantation may increase the donor concentration and the carrier concentration. That is, in regions other than the lifetime control region 104, the carrier concentration distribution may not be similar to the hydrogen concentration distribution. This deteriorates controllability of the donor concentration distribution and the carrier concentration distribution.

The carrier concentration distribution in the present example has a helium corresponding peak 112 between the hydrogen corresponding peak 111-3 and the hydrogen corresponding peak 111-4. The helium corresponding peak 112 is the peak of VOH defects caused by helium implantation. The helium corresponding peak 112 of the present example is located at a deeper position than the helium concentration peak 113. More specifically, at least one hydrogen concentration peak 115 is located between the helium corresponding peak 112 and the helium concentration peak 113.

In the present example, the hydrogen chemical concentration is relatively high in the region shallower than the helium concentration peak 113. Thus, in this region, with the donor concentration caused by hydrogen being sufficiently higher than the donor concentration caused by helium, the carrier concentration distribution and the hydrogen chemical concentration retain their similarity.

Thus, by implanting helium to the hydrogen containing region 102, a helium corresponding peak 112 or the like may occur in the carrier concentration distribution and the donor concentration distribution, and the carrier concentration distribution and the donor concentration distribution may not be similar to the hydrogen chemical concentration distribution. Therefore, when the lifetime control region 104 is formed in the hydrogen containing region 102 for example, controllability of the carrier concentration distribution and the donor concentration distribution in the hydrogen containing region 102 is deteriorated.

Figure 3:
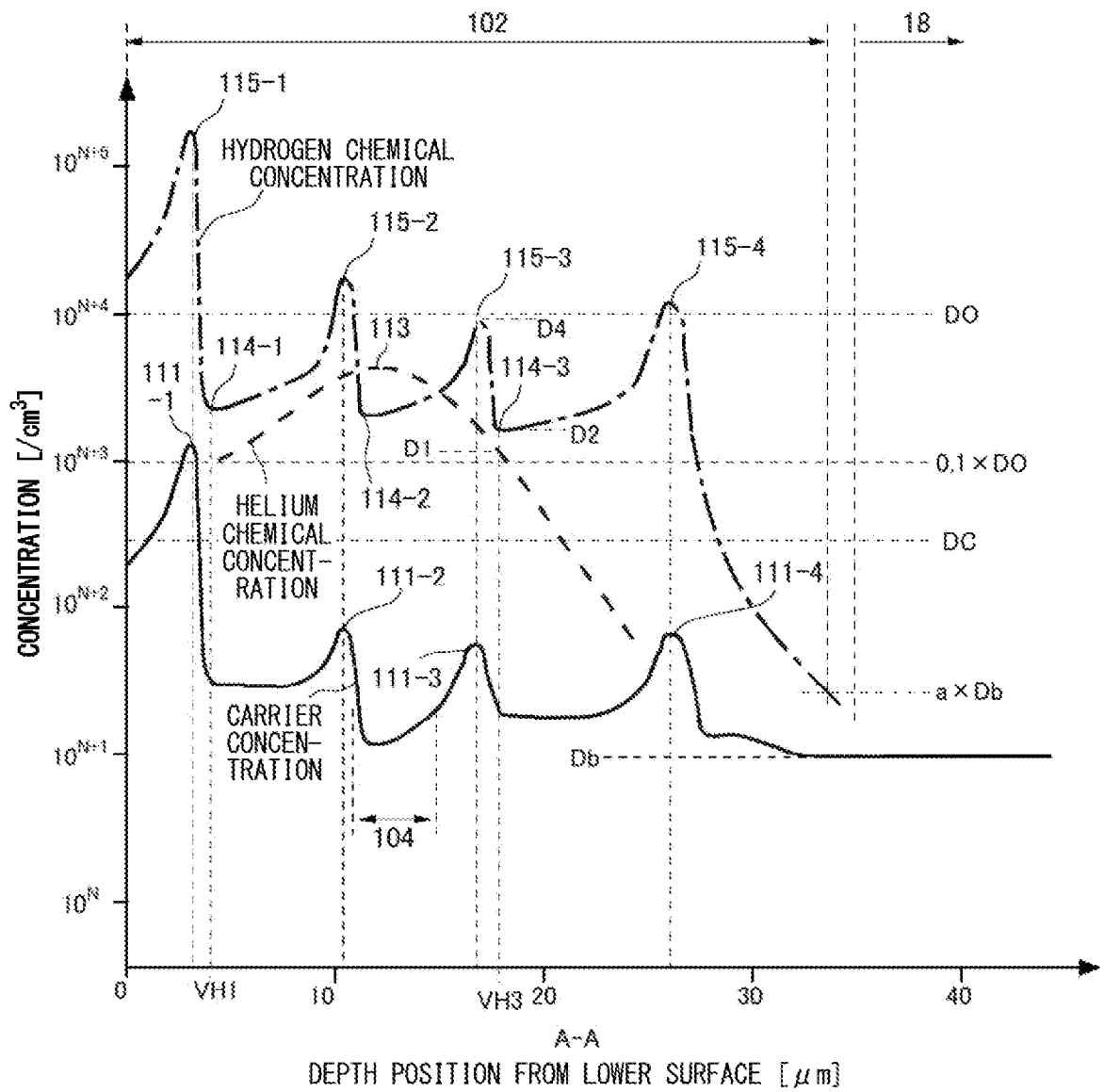
FIG. 3 is a diagram showing a hydrogen chemical concentration distribution, a helium chemical concentration distribution and a carrier concentration distribution according to one example of the present invention.

FIG. 3 is a diagram showing a hydrogen chemical concentration distribution, a helium chemical concentration distribution and a carrier concentration distribution according to one example of the present invention. In the semiconductor device 100 of the present example, a hydrogen chemical concentration in a hydrogen containing region 102 is higher than that of the example described in FIG. 2. The similarity of the carrier concentration distribution and the hydrogen chemical concentration distribution and the similarity of the donor concentration distribution and the hydrogen chemical concentration distribution can be retained by increasing the hydrogen chemical concentration. This can improve controllability of the carrier concentration distribution and the donor concentration distribution. Note that, elements that are not particularly described in FIG. 3 and subsequent figures may be similar to those of the example in FIG. 2.

In the present example, a hydrogen chemical concentration in each of the hydrogen concentration trough portions 114 is equal to or higher than $\frac{1}{10}$ of an oxygen chemical concentration DO. The hydrogen chemical concentration in each of the hydrogen concentration trough portions 114 has a local minimum of the chemical concentration in the hydrogen concentration trough portion 114. In FIG. 3, the oxygen chemical concentration DO is uniform in the entire semiconductor substrate 10. In the present example, the smallest value D2 of the local minimums of the hydrogen concentration in the plurality of hydrogen concentration trough portions 114 is equal to or higher than 0.1×DO. In FIG. 3, the hydrogen concentration trough portion 114-3 has the smallest local minimum D2.

A higher proportion of the oxygen that exists in the hydrogen containing region 102 can be attached to the vacancies caused by hydrogen implantation by holding the hydrogen chemical concentration, in particular, the hydrogen chemical concentration in at least one hydrogen concentration trough portion 114 equal to or higher than $\frac{1}{10}$ of the oxygen chemical concentration DO. That is, this allows a lower proportion of the oxygen that exists in the hydrogen containing region 102 to be attached to the vacancies caused by helium implantation. Thus, controllability of the carrier concentration distribution and the donor concentration distribution can be improved by increasing the similarity of the carrier concentration distribution and the hydrogen chemical concentration distribution and the similarity of the donor concentration distribution and the hydrogen chemical concentration distribution.

Helium implantation is preferably performed after steps of hydrogen implantation and thermal treatment. This enables oxygen to be attached to the vacancies caused by helium implantation after oxygen is attached to the vacancies caused by hydrogen implantation. The hydrogen chemical concentration in each of the hydrogen concentration trough portions 114 may be equal to or higher than 2/10 of the oxygen chemical concentration DO, or may be equal to or higher than 1/2 of the oxygen chemical concentration DO, or may be equal to or higher than one time the oxygen chemical concentration DO. Alternatively, the hydrogen chemical concentration in each of the hydrogen concentration trough portions 114 may be higher than the oxygen chemical concentration DO.

In the reference example shown in FIG. 2, the hydrogen chemical concentration D2 in the hydrogen concentration trough portion 114-3 is smaller than 1/10 of the oxygen chemical concentration DO. In this case, the helium corresponding peak 112 occurs in the carrier concentration distribution.

In the example shown in FIG. 3, the carrier concentration distribution between each of the hydrogen corresponding peaks 111-3, 111-4 has no helium corresponding peak 112 at a deeper position than the helium concentration peak 113. That is, the carrier concentration distribution between the hydrogen corresponding peak 111-3 and the hydrogen corresponding peak 111-4 has no local maximum. The carrier concentration distribution between the hydrogen corresponding peak 111-3 and the hydrogen corresponding peak 111-4 may have a downward-convex shape.

The oxygen chemical concentration DO in the hydrogen containing region 102 may be no less than $1 \times 10^{17}/cm^3$. The oxygen chemical concentration DO in the hydrogen containing region 102 may be no less than $5 \times 10^{17}/cm^3$ or may be no less than $1 \times 10^{18}/cm^3$. On the other hand, in order to prevent defects caused by oxygen, the oxygen chemical concentration DO in the hydrogen containing region 102 may be no more than $3 \times 10^{18}/cm^3$. Although the helium corresponding peak 112 shown in FIG. 2 becomes more prominent with a higher oxygen chemical concentration DO, the helium corresponding peak 112 can be suppressed by holding the hydrogen chemical concentration equal to or higher than 1/10 of the oxygen chemical concentration DO.

In addition, an experiment showed that, the higher the chemical concentration of carbon in the hydrogen containing region 102 is, the more prominent the helium corresponding peak 112 becomes. Even when the chemical concentration of carbon is high, however, the helium corresponding peak 112 can be suppressed by holding the hydrogen chemical concentration equal to or higher than 1/10 of the oxygen chemical concentration DO. The chemical concentration of carbon in the hydrogen containing region 102 may be no less than $1 \times 10^{14}/cm^3$, or may be no less than $5 \times 10^{14}/cm^3$, or may be no less than $1 \times 10^{15}/cm^3$.

An MCZ substrate fabricated by using the MCZ method may have a relatively high oxygen chemical concentration and a relatively high carbon chemical concentration. Also in this case, the helium corresponding peak 112 can be suppressed by holding the hydrogen chemical concentration equal to or higher than 1/10 of the oxygen chemical concentration DO. That is, even when a lifetime control region 104 is formed in a hydrogen containing region 102 in the MCZ substrate, a carrier concentration distribution and a donor concentration distribution in the hydrogen containing region 102 can be controlled with high accuracy.

In each of the hydrogen concentration trough portions 114, the hydrogen chemical concentration may be equal to or higher than the carbon chemical concentration DC. The helium corresponding peak 112 can be suppressed by increasing the hydrogen chemical concentration. In each of the hydrogen concentration trough portions 114, the hydrogen chemical concentration may be equal to or higher than 2 times the carbon chemical concentration DC, or may be equal to or higher than 5 times the carbon chemical concentration DC, or may be equal to or higher than 10 times the carbon chemical concentration DC.

Moreover, a local maximum of the hydrogen chemical concentration in each of the hydrogen concentration peaks 115 may be equal to or higher than 1/2 of the oxygen chemical concentration DO. In the present example, the smallest value D4 of the local maximums of the hydrogen concentration in the plurality of hydrogen concentration peaks 115 is equal to or higher than 0.5×DO. In FIG. 3, the hydrogen concentration peak 115-3 has the smallest local maximum D4. The helium corresponding peak 112 can be suppressed by increasing the hydrogen chemical concentration. A local maximum of the hydrogen chemical concentration in each of the hydrogen concentration peaks 115 may be equal to or higher than DO or may be equal to or higher than 2×DO.

Moreover, in at least one hydrogen concentration trough portion 114, the hydrogen chemical concentration may be equal to or higher than the helium chemical concentration. In the present example, at the hydrogen concentration trough portion 114-3 provided at a deeper position than the helium concentration peak 113, the hydrogen chemical concentration D2 is equal to or higher than the helium chemical concentration D1. The hydrogen chemical concentration D2 may be equal to or higher than 1.5 times the helium chemical concentration D1 or may be equal to or higher than 2 times the helium chemical concentration D1. The helium corresponding peak 112 can be suppressed by increasing the hydrogen chemical concentration D2 above the helium chemical concentration D1. In the hydrogen containing region 102, the hydrogen chemical concentration may be equal to or higher than the helium chemical concentration at a deeper position than the hydrogen concentration trough portion 114-3.

At a position VH3 in the hydrogen concentration trough portion 114-3, the hydrogen chemical concentration may be equal to or higher than a helium chemical concentration. The position VH3 in the hydrogen concentration trough portion 114-3 is located deeper than the hydrogen corresponding peak 111-3 (or the hydrogen chemical concentration peak 115-3) relative to the lower surface 23. Moreover, the hydrogen corresponding peak 111-3 (or the hydrogen chemical concentration peak 115-3) is located deeper than the helium concentration peak 113. At a position VH1 of the hydrogen concentration trough portion 114-1, the hydrogen chemical concentration may be equal to or higher than a helium chemical concentration. The position VH1 of the hydrogen concentration trough portion 114-1 is located shallower than the hydrogen corresponding peak 111-2 (or the hydrogen chemical concentration peak 115-2) relative to the lower surface 23. Moreover, the hydrogen corresponding peak 111-2 (or the hydrogen chemical concentration peak 115-2) is located shallower than the helium concentration peak 113.

The carrier concentration in the hydrogen containing region 102 may be higher than the base doping concentration Db in the semiconductor substrate 10. However, the carrier concentration in the lifetime control region 104 may be higher than the base doping concentration Db or may be equal to or lower than the base doping concentration Db.

Figure 4:
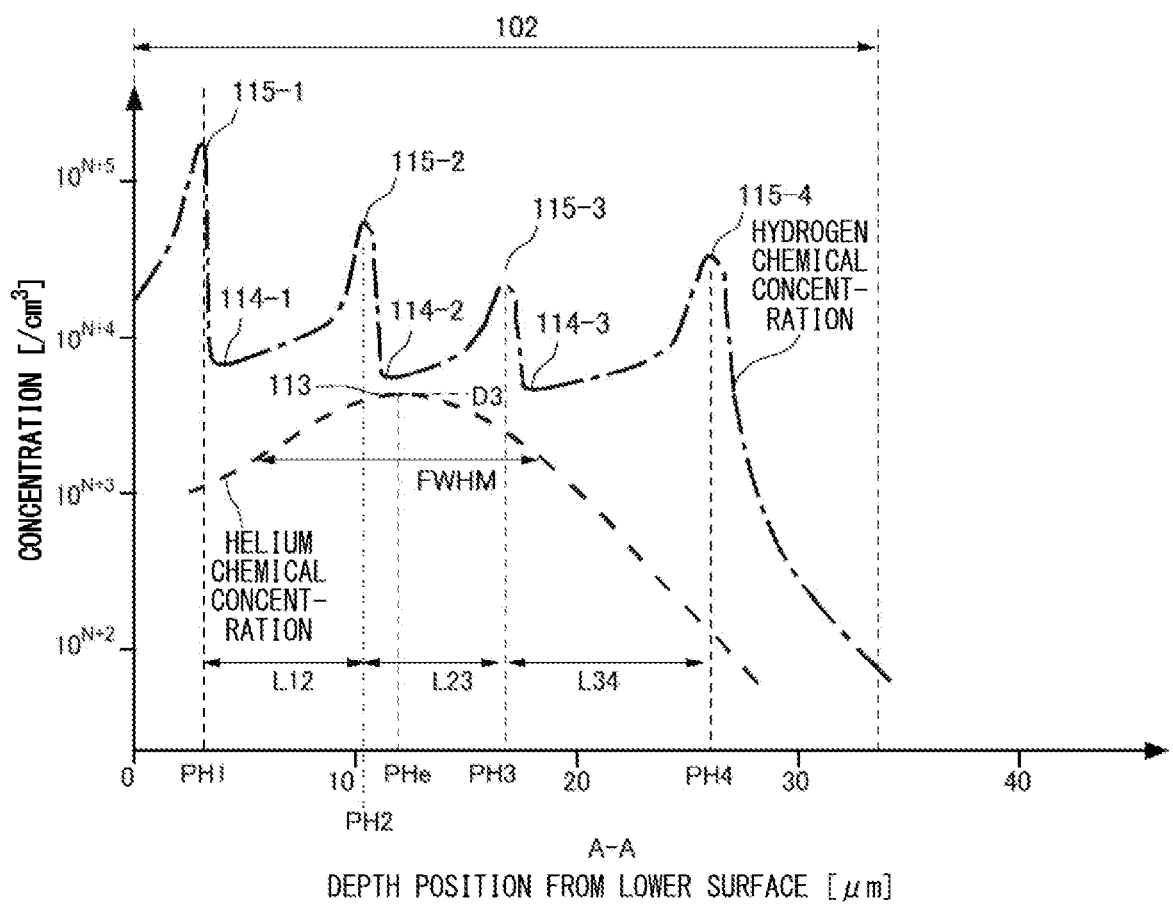
FIG. 4 is a diagram showing another example of a hydrogen chemical concentration distribution and a helium chemical concentration distribution in a hydrogen containing region 102.

FIG. 4 is a diagram showing another example of a hydrogen chemical concentration distribution and a helium chemical concentration distribution in a hydrogen containing region 102. In the present example, the hydrogen chemical concentration is equal to or higher than the helium chemical concentration in all the hydrogen concentration trough portions 114 of the hydrogen chemical concentration distribution. The hydrogen chemical concentration in all the hydrogen concentration trough portions 114 may be equal to or higher than the peak value D3 of the helium chemical concentration. Thus, the helium corresponding peak 112 can be further suppressed.

A width of an inter-peak region between each of the hydrogen concentration peaks 115 is labeled as L. In the example of FIG. 4, the width of the inter-peak region between the hydrogen concentration peaks 115-1 and 115-2 is labeled as L12, the width of the inter-peak region between the hydrogen concentration peak 115-2 and the hydrogen concentration peak 115-3 is labeled as L23, and the width of the inter-peak region between the hydrogen concentration peak 115-3 and the hydrogen concentration peak 115-4 is labeled as L34.

The full width at half maximum FWHM of the helium concentration peak 113 may be larger than the width L of any inter-peak region. A plurality of hydrogen concentration peaks 115 may be included in the range of the full width at half maximum FWHM of the helium concentration peak 113. In the example of FIG. 4, the hydrogen concentration peaks 115-2, 115-3 are included in the range of the full width at half maximum FWHM. The full width at half maximum FWHM of the helium concentration peak 113 may be no less than 5 μm or may be no less than 10 μm. In the example of FIG. 3, the full width at half maximum FWHM of the helium concentration peak 113 may be similar to that in the example of FIG. 4.

A depth position at which the helium concentration peak 113 has its local maximum is labeled as PHe. Depth positions at which the hydrogen concentration peaks 115-1, 115-2, 115-3, and 115-4 have their local maximums are labeled as PH1, PH2, PH3, and PH4, respectively. Each depth position corresponds to the range of helium or hydrogen being implanted to the semiconductor substrate 10.

The respective positions PH1, PH2, PH3, and PH4 of the hydrogen concentration peaks 115 may be located within the range from the lower surface 23 of the semiconductor substrate 10 to the depth position of 2×PHe. By positioning the hydrogen concentration peaks 115 in a relatively narrow range around the helium concentration peak 113, the hydrogen chemical concentration in the hydrogen concentration trough portions 114 can easily be increased. Thus, the helium corresponding peak 112 can be suppressed. In the example of FIG. 3, the positions of the hydrogen concentration peaks 115 and the helium concentration peak 113 may be similar to those of the example of FIG. 4.

Figure 5:
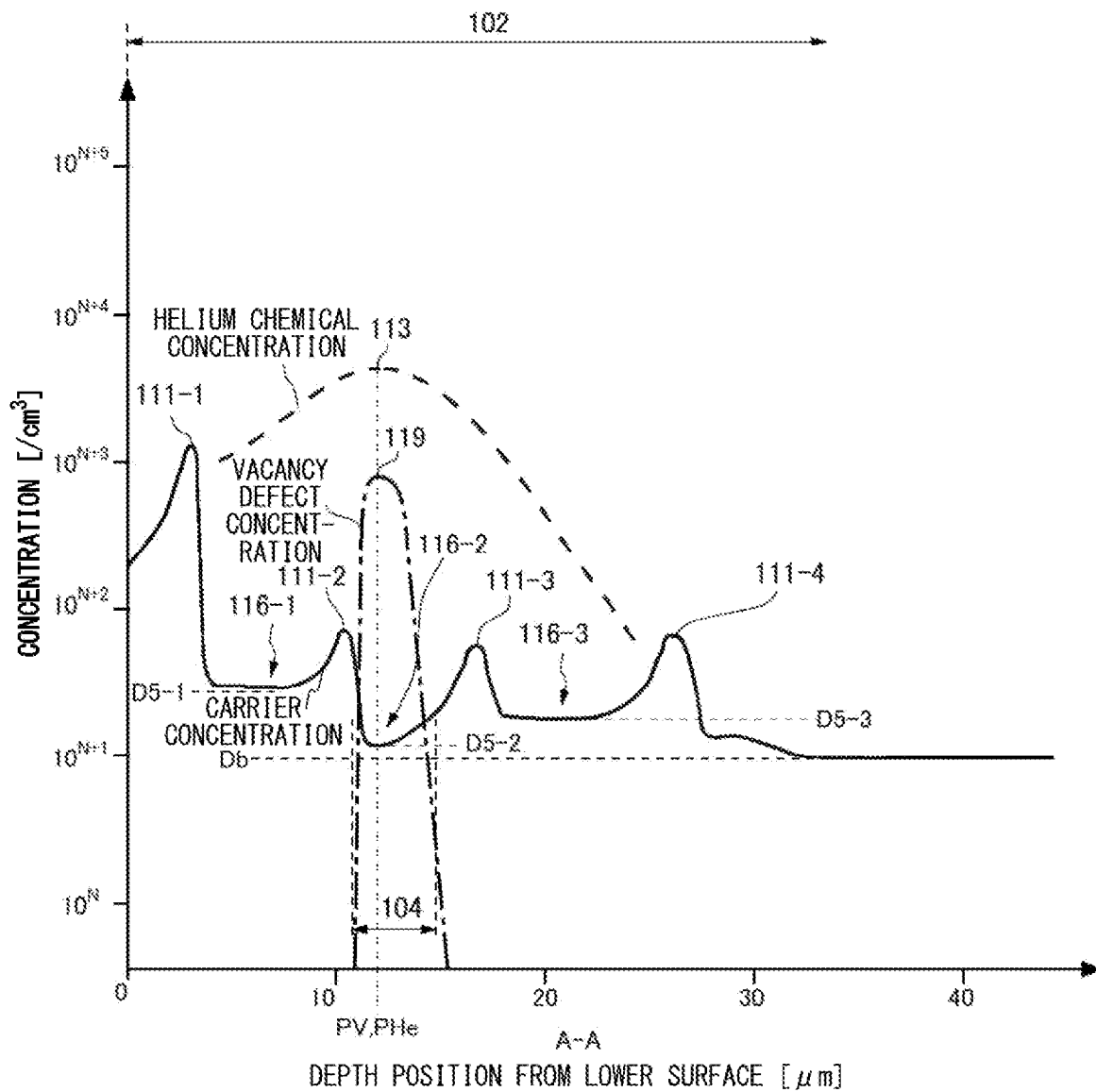
FIG. 5 is a diagram showing one example of the relationship of a helium chemical concentration distribution and a carrier concentration distribution in the hydrogen containing region 102.

FIG. 5 is a diagram showing one example of the relationship of a helium chemical concentration distribution and a carrier concentration distribution in the hydrogen containing region 102. FIG. 5 also shows a peak 119 of a vacancy defect concentration distribution. The vacancy defect concentration distribution is a concentration distribution of vacancy defects caused by helium ion implantation. The configuration described in FIG. 5 may be applied to any of the example shown in FIG. 3 and the example shown in FIG. 4.

The carrier concentration distribution has carrier concentration trough portions 116 between each of the hydrogen corresponding peaks 111. The carrier concentration distribution in the present example has, in order from the lower surface 23 side of the semiconductor substrate 10, a carrier concentration trough portion 116-1, a carrier concentration trough portion 116-2, and a carrier concentration trough portion 116-3. The carrier concentration trough portions 116 may contain a flat region in which the carrier concentration remains constant.

A local minimum of the carrier concentration in each of the carrier concentration trough portions 116 is labeled as D5. The local minimum D5 is the smallest value of a carrier concentration within a range between two hydrogen corresponding peaks 111.

A local minimum D5-2 of the carrier concentration in the carrier concentration trough portion 116-2 at the same depth position as the helium concentration peak 113 may be lower than any of local minimums D5-1, D5-3 of the carrier concentration of the carrier concentration trough portions 116-1, 116-3 before and after this carrier concentration trough portion 116-2. Thus, the lifetime control region 104 can be formed. The local minimum D5-2 of the carrier concentration in the carrier concentration trough portion 116-2 may be higher than the base doping concentration Db in the semiconductor substrate 10. The local minimums D5-1, D5-3 of the carrier concentration in the carrier concentration trough portions 116-1, 116-3 may be higher than the base doping concentration Db in the semiconductor substrate 10.

The peak 119 of the vacancy defect concentration distribution may be located in the vicinity of the helium concentration peak 113 of the helium concentration distribution. In the present example, a peak position PV of the peak 119 is identical to a peak position PHe of the helium concentration peak 113. The peak 119 of the vacancy defect concentration distribution has a narrower distribution width than the distribution width of the helium concentration peak 113 of the helium concentration distribution. The peak 119 of the vacancy defect concentration distribution may be distributed between the hydrogen corresponding peak 111-2 and the hydrogen corresponding peak 111-3 of the carrier concentration. Vacancy defects are formed in the interior of the semiconductor substrate 10 by ion implantation of an adjustment impurity. Hydrogen that exists around the vacancy defects terminates the dangling bonds of the vacancy defects. This decreases the concentration of the vacancy defects formed in the interior of the semiconductor substrate 10. At the hydrogen corresponding peak 111-2 and the hydrogen corresponding peak 111-3 with high hydrogen chemical concentrations, the vacancy defect concentration is particularly decreased because of the high hydrogen chemical concentrations. Thus, the vacancy defect concentration is distributed only between the hydrogen corresponding peak 111-2 and the hydrogen corresponding peak 111-3. Gradients of the concentration slopes on both sides of the peak position PV of the vacancy defect concentration distribution may be larger than gradients of the concentration slopes on both sides of the peak position PHe of the helium concentration distribution.

Figure 6:
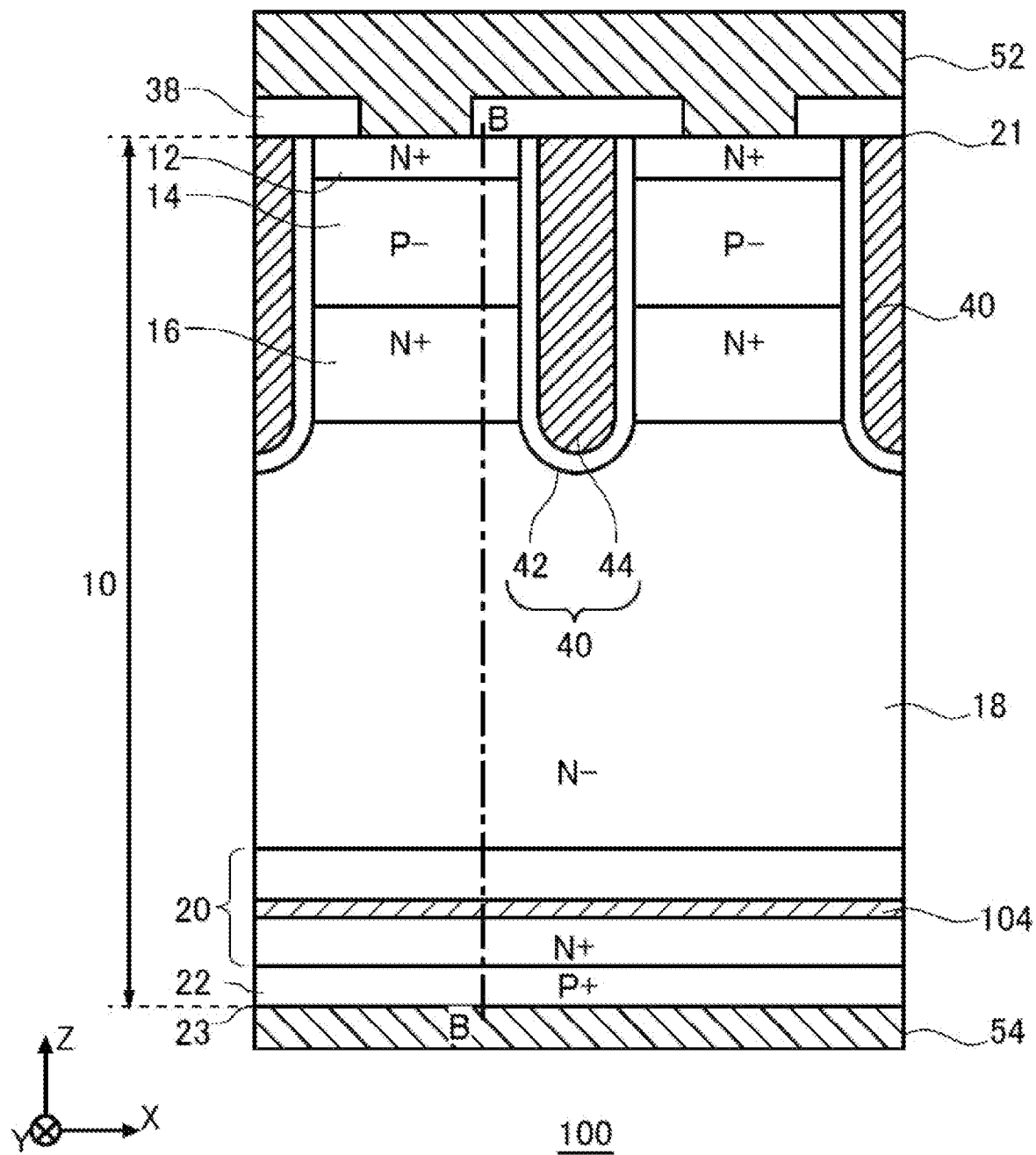
FIG. 6 is a view showing an exemplary structure of the semiconductor device 100.

FIG. 6 is a view showing an exemplary structure of the semiconductor device 100. The semiconductor device 100 of the present example serves as an insulated gate bipolar transistor (IGBT). The semiconductor device 100 of the present example has a semiconductor substrate 10, an interlayer dielectric film 38, an emitter electrode 52 and a collector electrode 54. The interlayer dielectric film 38 is formed to cover at least part of an upper surface 21 of the semiconductor substrate 10. The interlayer dielectric film 38 has a through hole such as a contact hole formed therein. The contact hole exposes the upper surface 21 of the semiconductor substrate 10. The interlayer dielectric film 38 may be made of a silicate glass such as a PSG, BPSG or the like, and may be an oxide film, a nitride film or the like.

The emitter electrode 52 is formed on the upper surfaces of the semiconductor substrate 10 and the interlayer dielectric film 38. The emitter electrode 52 is also formed in the contact hole, and is in contact with the upper surface 21 of the semiconductor substrate 10 exposed by the contact hole.

The collector electrode 54 is formed on a lower surface 23 of the semiconductor substrate 10. The collector electrode 54 may be in contact with the entire lower surface 23 of the semiconductor substrate 10. The emitter electrode 52 and the collector electrode 54 are formed of a metal material such as aluminum.

The semiconductor substrate 10 of the present example is provided with an N-type drift region 18, an N+ type emitter region 12, and a P− type base region 14, an N+ type accumulation region 16, an N+ type buffer region 20, and a P+ type collector region 22.

The emitter region 12, which is provided in contact with the upper surface 21 of the semiconductor substrate 10, is a region which has a higher donor concentration than that of the drift region 18. The emitter region 12 contains an N type impurity such as, for example, phosphorous.

The base region 14 is provided between the emitter region 12 and the drift region 18. The base region 14 contains a P type impurity such as boron, for example.

The accumulation region 16, which is provided between the base region 14 and the drift region 18, has one or more donor concentration peaks with higher donor concentrations than that of the drift region 18. The accumulation region 16 may contain an N type impurity such as phosphorous, and may contain hydrogen.

The collector region 22 is provided in contact with the lower surface 23 of the semiconductor substrate 10. An acceptor concentration of the collector region 22 may be higher than an acceptor concentration in the base region 14. The collector region 22 may contain a P type impurity that is the same as or different from those contained in the base region 14.

The buffer region 20 is provided between the collector region 22 and the drift region 18, and has one or more donor concentration peaks with higher donor concentrations than that of the drift region 18. The buffer region 20 contains an N type impurity such as hydrogen. The buffer region 20 may serve as a field stop layer to prevent a depletion layer expanded from the lower surface side of the base region 14 from reaching the collector region 22.

The hydrogen containing region 102 described in FIG. 1 to FIG. 5 is included in the buffer region 20. In the present example, the hydrogen containing region 102 serves as the buffer region 20 as a whole. The buffer region 20 of the present example includes the lifetime control region 104 described in FIG. 1 to FIG. 5.

According to the semiconductor device 100 of the present example, the carrier concentration distribution and the donor concentration distribution in the buffer region 20 can be controlled with high accuracy. Thus, characteristics of the semiconductor device 100 can be controlled with high accuracy.

A gate trench portion 40 passes through the emitter region 12, the base region 14 and the accumulation region 16 from the upper surface 21 of the semiconductor substrate 10 to reach the drift region 18. The accumulation region 16 of the present example is located above the lower end of the gate trench portion 40. The accumulation region 16 may be provided to cover the entire lower surface of the base region 14. By providing the accumulation region 16 with a higher concentration than that of the drift region 18 between the drift region 18 and the base region 14, a carrier injection-enhancement effect (IE effect) can be increased to reduce the ON voltage in IGBT.

The gate trench portion 40 has a gate trench, a gate insulating film 42 and a gate conductive portion 44 formed in the upper surface side of the semiconductor substrate 10. The gate insulating film 42 is formed to cover an inner wall of the gate trench. The gate insulating film 42 may be formed by oxidizing or nitriding a semiconductor on the inner wall of the gate trench. The gate insulating film 42 is formed inside the gate trench, and the gate conductive portion 44 is formed inside the gate insulating film 42. In other words, the gate insulating film 42 insulates the gate conductive portion 44 from the semiconductor substrate 10. The gate conductive portion 44 is formed of a conductive material such as polysilicon.

The gate conductive portion 44 includes a region opposed to the base region 14 across the gate insulating film 42. Although in this cross-section the gate trench portion 40 is covered by the interlayer dielectric film 38 at the upper surface of the semiconductor substrate 10, in another cross section the gate conductive portion 44 is connected to the gate electrode. When a predetermined gate voltage is applied to the gate conductive portion 44, a channel is formed by an electron inversion layer in a surface layer of the base region 14 at a boundary in contact with the gate trench portion 40.

Figure 7:
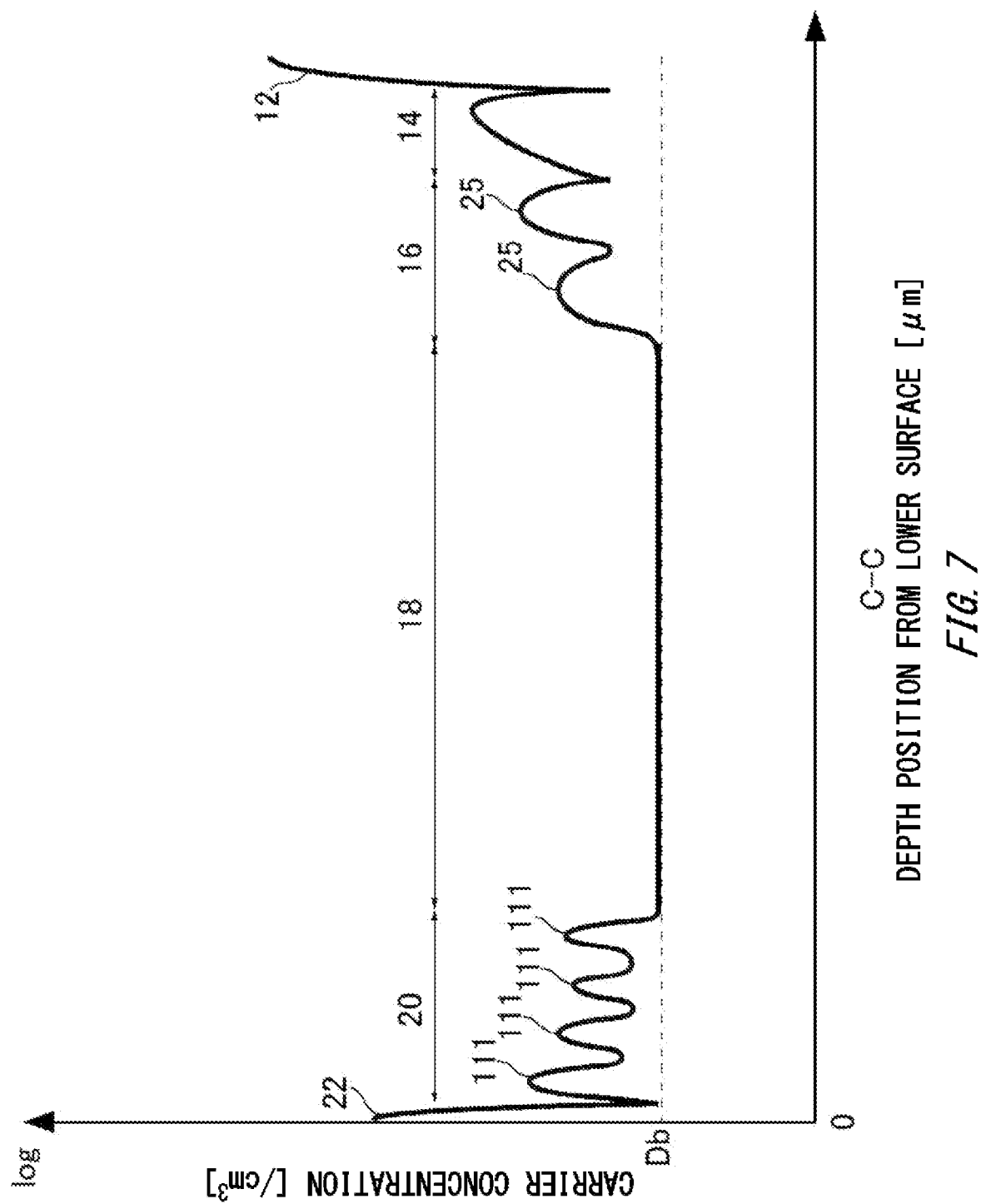
FIG. 7 is a diagram showing one example of a carrier concentration distribution in a depth direction at the position of the line B-B in FIG. 6.

FIG. 7 is a diagram showing one example of a carrier concentration distribution in a depth direction at the position of the line B-B in FIG. 6. In FIG. 7, the vertical axis is a logarithmic axis indicating the carrier concentration, and the horizontal axis is a linear axis indicating the distance from the lower surface 23.

The carrier concentration distribution in the buffer region 20 of the present example has a plurality of hydrogen corresponding peaks 111 provided at different positions in the depth direction. The carrier concentration distribution in the buffer region 20 can be controlled with high accuracy, and thus the expansion of the depletion layer from the upper surface 21 side can be suppressed with high accuracy.

Although the accumulation region 16 of the present example has a plurality of peaks 25, the accumulation region 16 may have a single peak 25. The peak 25 is a peak of the donor concentration. The peak 25 may be formed by hydrogen implantation. In this case, the accumulation region 16 may contain the hydrogen containing region 102.

Figure 8:
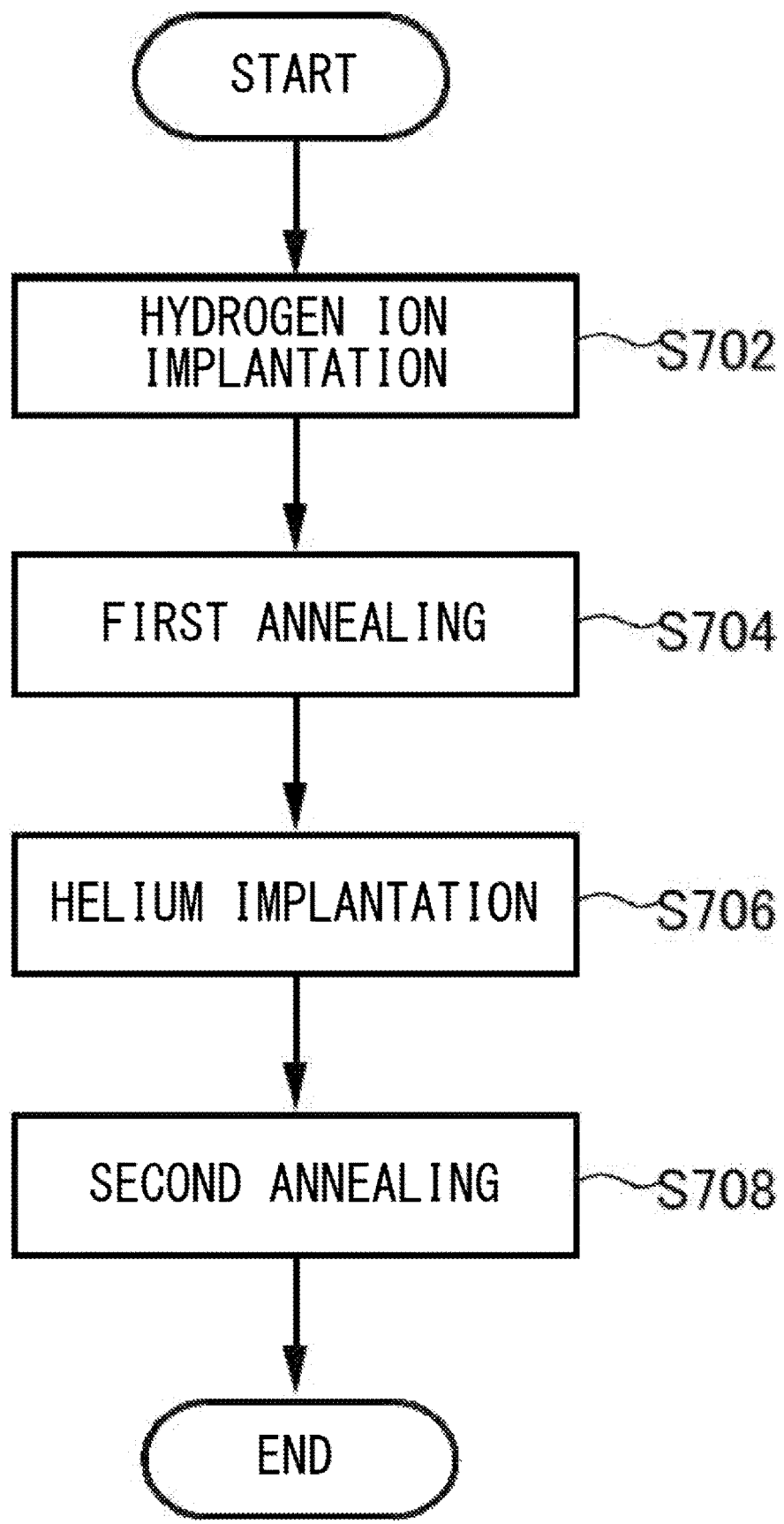
FIG. 8 is a chart showing some steps in a fabrication method of the semiconductor device 100.

FIG. 8 is a chart showing some steps in a fabrication method of the semiconductor device 100. FIG. 8 shows a process of forming the hydrogen containing region 102. Before and after the process shown in FIG. 8, each structure shown in FIG. 6 is formed.

In S702, hydrogen ions are implanted from the lower surface 23 side of the semiconductor substrate 10. In S702, hydrogen ions may be implanted multiple times with varied ranges. Next, in S704, the semiconductor substrate 10 is annealed. This generates hydrogen donors and VOH defects and forms the hydrogen containing region 102.

Next, in S706, helium is implanted from the lower surface 23 side of the semiconductor substrate 10 so that the helium is contained in at least some region of the hydrogen containing region 102. The total dosage of the hydrogen ions in S702 may be equal to or higher than 5 times the total dosage of helium in S706. The helium corresponding peak 112 can be suppressed by increasing the dosage of hydrogen ions. The total dosage of hydrogen ions may be equal to or higher than 10 times the total dosage of helium. Moreover, the dosage in each range of the hydrogen ions may be equal to or higher than 5 times the total dosage of helium. Note that the dosages and ranges in S702 and S706 are adjusted so that each concentration distribution described in FIG. 1 to FIG. 7 can be obtained.

Next, in S708, the semiconductor substrate 10 is annealed. The annealing condition in S708 may be the same as or different from the annealing condition in S704. In S708, a lifetime control region 104 is formed in the hydrogen containing region 102 by performing thermal treatment of the semiconductor substrate 10.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate, 12: emitter region, 14: base region, 16: accumulation region, 18: drift region, 20: buffer region, 21: upper surface, 22: collector region, 23: lower surface, 25: peak, 38: interlayer dielectric film, 40: gate trench portion, 42: gate insulating film, 44: gate conductive portion, 52: emitter electrode, 54: collector electrode, 100: semiconductor device, 102: hydrogen containing region, 104: lifetime control region, 111: hydrogen corresponding peak, 112: helium corresponding peak, 113: helium concentration peak, 114: hydrogen concentration trough portion, 115: hydrogen concentration peak, 116: carrier concentration trough portion, 119: peak.

What is claimed is:

1. A semiconductor device comprising a semiconductor substrate, the semiconductor substrate having an upper surface and a lower surface, wherein
the semiconductor substrate has a hydrogen containing region that contains hydrogen,
the hydrogen containing region contains a lifetime control region,
a carrier concentration distribution of the hydrogen containing region in a depth direction has:
a first local maximum point having a local maximum value in a carrier concentration;
a second local maximum point positioned closest to the first local maximum point among one or more upper-side local maximum points positioned between the first local maximum point and the upper surface and each having a local maximum value in the carrier concentration;
a first intermediate point positioned between the first local maximum point and the second local maximum point and having a local minimum value in the carrier concentration; and
a second intermediate point positioned closest to the second local maximum point among (i) one or more upper-side local minimum points positioned between the second local maximum point and the upper surface and each having a local minimum value in the carrier concentration or (ii) a plurality of upper-side flat points at which the carrier concentration remains constant in the depth direction, the plurality of upper-side flat points positioned between the second local maximum point and the upper surface,
the lifetime control region is positioned at least between the first local maximum point and the second local maximum point, and
the carrier concentration at the first intermediate point is lower than the carrier concentration at the second intermediate point.

2. The semiconductor device according to claim 1, wherein
the carrier concentration distribution further has a third intermediate point positioned closest to the first local maximum point among (i) one or more lower-side local minimum points positioned between the first local maximum point and the lower surface and each having a local minimum value in the carrier concentration or (ii) a plurality of lower-side flat points at which the carrier concentration remains constant in the depth direction, the plurality of lower-side flat points positioned between the first local maximum point and the lower surface, and
the carrier concentration at the first intermediate point is lower than the carrier concentration at the third intermediate point.

3. The semiconductor device according to claim 1, wherein
the carrier concentration at the first intermediate point is higher than a base doping concentration of the semiconductor substrate.

4. The semiconductor device according to claim 1, wherein
the carrier concentration at the first intermediate point is lower than a base doping concentration of the semiconductor substrate.

5. The semiconductor device according to claim 1, wherein
the carrier concentration distribution further has a third local maximum point positioned closest to the second local maximum point between the second local maximum point and the upper surface among the one or more upper-side local maximum points, and
the second intermediate point indicates the local minimum value in the carrier concentration between the second local maximum point and the third local maximum point.

6. The semiconductor device according to claim 2, wherein
the carrier concentration distribution further has a fourth local maximum point positioned closest to the first local maximum point among one or more lower-side local maximum points positioned between the first local maximum point and the lower surface and each having a local maximum value in the carrier concentration, and the third intermediate point indicates the local minimum value in the carrier concentration between the first local maximum point and the fourth local maximum point.

7. The semiconductor device according to claim 1, wherein
the lifetime control region is a region having a recombination center of carriers.

8. The semiconductor device according to claim 1, wherein
the lifetime control region is a region in which an element that generates a lifetime killer is implanted.

9. The semiconductor device according to claim 8, wherein
the element includes one of helium, neon, argon, or platinum.

10. The semiconductor device according to claim 9, wherein
a chemical concentration peak of the element is positioned between the first local maximum point and the second local maximum point.

11. The semiconductor device according to claim 8, wherein
a hydrogen chemical concentration distribution of the hydrogen containing region in the depth direction has one or more hydrogen concentration trough portions, and in each of the one or more hydrogen concentration trough portions a hydrogen chemical concentration is equal to or higher than $\frac{1}{10}$ of an oxygen chemical concentration, and
in at least one of the one or more hydrogen concentration trough portions, the hydrogen chemical concentration is equal to or higher than a chemical concentration of the element.

12. The semiconductor device according to claim 11, wherein
in each of the one or more hydrogen concentration trough portions, the hydrogen chemical concentration is equal to or higher than a carbon chemical concentration.

13. The semiconductor device according to claim 11, wherein
the hydrogen chemical concentration distribution of the hydrogen containing region in the depth direction has one or more hydrogen concentration peaks, and
at the one or more hydrogen concentration peaks, the hydrogen chemical concentration is equal to or higher than $\frac{1}{2}$ of the oxygen chemical concentration.

14. The semiconductor device according to claim 11, wherein
in a hydrogen concentration trough portion positioned deeper than a chemical concentration peak of the element among the one or more hydrogen concentration trough portions, the hydrogen chemical concentration is equal to or higher than the chemical concentration of the element.

15. The semiconductor device according to claim 13, wherein
the one or more hydrogen concentration peaks include:
a first hydrogen concentration peak;
a second hydrogen concentration peak positioned between the first hydrogen concentration peak and the upper surface and adjacent to the first hydrogen concentration peak;
a third hydrogen concentration peak positioned between the second hydrogen concentration peak and the upper surface; and
a fourth hydrogen concentration peak positioned between the first hydrogen concentration peak and the lower surface, and
a full width at half maximum of a chemical concentration peak of the element in a chemical concentration distribution of the element is larger than an interval between two adjacent hydrogen concentration peaks among the first hydrogen concentration peak, the second hydrogen concentration peak, the third hydrogen concentration peak, and the fourth hydrogen concentration peak.

* * * * *